(12) United States Patent
Kajiura et al.

(10) Patent No.: US 6,320,776 B1
(45) Date of Patent: Nov. 20, 2001

(54) POWER DRIVE APPARATUS

(75) Inventors: Goichi Kajiura; Hiroki Ichikawa, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/690,757

(22) Filed: Oct. 18, 2000

Related U.S. Application Data

(63) Continuation of application No. PCT/JP99/00843, filed on Feb. 24, 1999.

(51) Int. Cl.[7] .............. H02M 1/10; H05K 7/20
(52) U.S. Cl. .............................. 363/141; 361/709
(58) Field of Search ........................ 363/141, 143, 363/144; 361/704, 707, 718, 736, 752, 709

(56) References Cited

U.S. PATENT DOCUMENTS

| | | | |
|---|---|---|---|
| 4,177,499 | * 12/1979 | Volkmann | 361/388 |
| 5,497,289 | * 3/1996 | Sugishima et al. | 361/709 |
| 5,548,481 | * 8/1996 | Salisbury et al. | 361/709 |
| 5,752,838 | 5/1998 | Nishizawa | 439/52 |

FOREIGN PATENT DOCUMENTS 8-308250  5/1998  (JP) .................. H01R/29/00

* cited by examiner

Primary Examiner—Rajnikant B. Patel
(74) Attorney, Agent, or Firm—Sughrue, Mion, Zinn, Macpeak & Seas, PLLC

(57) ABSTRACT

The power drive apparatus comprises a main circuit board including an input terminal block for connection to power-source wires mounted on a major surface of the main circuit board; a power module including a converter unit having diodes and an inverter unit having switching devices and diodes, the power module, mounted on the other major surface of the main circuit board, being for converting and outputting electric power supplied through the input terminal block; a heat-dissipating plate, connected with the power module in contact with a surface of the power module opposite to the main circuit board, for dissipating heat generated by the power module; and a filter module including a filter substrate, provided with a filter circuit and being disposed in the middle of an interconnecting path between the input terminal block and an input section of the converter unit, for suppressing the transmission of noise generated by the switching devices to a power source side, wherein the heat-dissipating plate provides therein a concave space, and the filter module is received in the concave space and detachably mounted on the heat-dissipating plate.

4 Claims, 7 Drawing Sheets

POWER DRIVE APPARATUS

This is a continuations of International PCT/JP99/00843, with an international filing date of Feb. 24, 1999, the contents of which being hereby incorporated into this application.

BACKGROUND OF THE INVENTION

1. Field of the Invention

The present invention relates to power drive apparatuses, such as inverters and servo amplifiers, including switching devices for converting and outputting electric power. In particular, the present invention relates to a power drive apparatus, in which a filter is mountable, the filter serving to suppress the transmission of noise generated by the switching devices to an input power source.

2. Description of the Related Art

FIG. 7 is an exploded perspective view of a known separate-filter-type power drive apparatus.

In FIG. 7, the power drive apparatus includes a case 1, a main circuit board 2 received in the case 1 and provided with an input terminal block 3 and a power module including switching devices for converting and outputting power, and a heat-dissipating plate 4 disposed at the bottom of the case 1 and for dissipating heat generated by heat-generating parts such as the switching devices mounted on the main circuit board 2. A filter unit 6, which is provided with a filter circuit including a choke coil, capacitors, and the like, is fixed by screws 5 to the heat-dissipating plate 4 at the bottom thereof. Relay wires 12 are connected with a filter-output-terminal block 8 at filter-side terminals 12a of the relay wires 12 and are connected with the input terminal block 3 at drive-side terminals 12b of the relay wires 12, whereby the power drive apparatus and the filter unit 6 are connected to each other through the relay wires 12. Power-source wires 10 are connected with a filter-input-terminal block 7, whereby the filter unit 6 and a power source (not shown) are connected to each other through the power-source wires 10.

The power drive apparatus including the filter unit 6 thus assembled is installed by screws 9 in an installation location.

As shown in FIG. 8, in the known separate-filter-type power drive apparatus, the filter unit 6 is disposed between a power source 11 and the input terminal block 3, in which the filter unit 6 suppresses the transmission of noise to the power source 11 from the switching devices included in a power module 18 mounted on the main circuit board 2.

However, in the known separate-filter-type power drive apparatus, the power source 11 and the filter-input-terminal block 7 were connected by the power-source wires 10, and the filter-output-terminal block 8 and the input terminal block 3 were connected by the relay wires 12, whereby productivity was decreased due to wiring processes, and the relay wires 12 must be prepared for interconnection due to the configuration of the separate-filter-type. The unit could not be reduced in size because the filter unit 6 was separated, and a mounting space for the filter unit 6 was required to be prepared outside the power drive apparatus. Moreover, when the power drive apparatus is used without using the filter unit 6, the power-source wires 10 must be connected with the input terminal block 3, and when the power drive apparatus is used together with the filter unit 6, the power-source wires 10 must be reconnected with the filter-input-terminal block 7 and the relay wires 12 must be connected with the filter-output-terminal block 8 and the input terminal block 3. That is, wiring must be changed according to the use. In this case, the power drive apparatus must be changed in the position according to the use, because the direction of connection of the power-source wires 10 was different between the input-terminal block 3 and the filter-input-terminal block 7.

In order to overcome these problems of the separate-filter-type power drive apparatus, a filter-built-in-type power drive apparatus has been proposed.

As shown in FIG. 9, the filter-built-in-type power drive apparatus is provided with a filter circuit 13 including a choke coil 14, a capacitor 15, and the like mounted on a main circuit board 2. The main circuit board 2 is received in the case 1, thereby eliminating the filter unit 6 shown in FIG. 7.

Referring to FIG. 10, in the known filter-built-in-type power drive apparatus, the filter circuit 13 is provided between an input terminal block 3 and a power module 18, thereby suppressing the transmission of noise to a power source 11 from a switching device included in the power module 18.

However, the known filter-built-in-type power drive apparatus must always contain the filter circuit 13 whether it is necessary or not. Although in Europe the suppression of noise is required by regulations, no filter is occasionally used in other regions. Consequently, unnecessary filter circuit 13 was mounted on the power drive apparatus in that case; as a result, the cost of the power drive apparatus was increased by an unnecessary component.

A known power drive apparatus has been proposed in, for example, Japanese Unexamined Patent Application Publication No. 8-308250, in which a filter unit is mounted on the power drive apparatus by applying a particular structure to an input terminal block of the power drive apparatus.

FIG. 11 is a perspective view of a power drive apparatus including an input terminal block having the particular structure disclosed in, for example, Japanese Unexamined Patent Application Publication No. 8-308250. FIG. 12 is a sectional view of the power drive apparatus shown in FIG. 11, in which a filter unit is mounted.

A known power drive apparatus 301 is provided with heat-dissipating fins 311 at the bottom thereof, and a filter unit 303a is also provided with heat-dissipating fins 311a at the bottom thereof. An input terminal block 302 of the power drive apparatus 301 includes terminals R, S, and T connectable to a power source, terminals U, V, and W connectable to an external device, and a terminal G (grounding) connectable to the both sides. Each terminal of the input terminal block 302 is configured in a manner such that a pair of conductive flat springs 315 and 316 are supported, opposing to overlap each other, by an insulative member 313 at one end of each flat spring 315 or 316, and the flat spring 315 is fixed to the insulative member 313 by a screw 314 so that the flat spring 315 is pressed to make contact with the flat spring 316. The pair of flat springs 315 and 316 form a female terminal 305. The other end of the flat spring 316 is connected to an interconnecting pattern 317A of a substrate 317 included in the power drive apparatus 301.

A filter unit 303a includes female terminals 305a, male terminals 304a, a substrate 325a, and a common mode reactor 310a. The female terminals 305a are formed on an end of the substrate 325a, and the male terminals 304a are formed on the other end of the substrate 325a. Each of the female terminals 305a is constituted by a pair of conductive contact parts 322a and 322b, and an insulative member 321a for fixing the contact parts 322a and 322b.

A power-source wire 10 is electrically connected to the flat springs 315 which are pressed by the screws 314. When the male terminals 304a are not inserted between the flat springs 315 and 316, the flat springs 315 and 316 are connected with each other by being pressed by the screws 314. An electrical current from the power source is supplied inside the power drive apparatus 301 through the flat springs 315 and 316, and the interconnecting pattern 317A.

The filter unit 303a is mounted on the power drive apparatus 301 by inserting the male terminals 304a between the flat springs 315 and 316. As shown in FIG. 12, the electrical current from the power source is supplied inside the power drive apparatus 301 through the flat spring 315, the upper face of the male terminal 304a, an interconnecting pattern 324a formed on the upper surface of the substrate 325a, the contact parts 322a and 322b, an interconnecting pattern 324b formed on the lower surface of the substrate 325a, the common mode reactor 310a, an interconnecting pattern 324c formed on the lower surface of the substrate 325a, the lower face of the male terminal 304a, the flat spring 316, and the interconnecting pattern 317A.

In this case, the filter unit 303a is disposed between the input terminal block 302 and a power module including switching devices, thereby suppressing the transmission of noise from the switching devices to the power source.

However, in the known power drive apparatus, a space for mounting the filter unit 303a is required outside the power drive apparatus 301, whereby the overall size of the apparatus is increased, and manufacturing cost is increased because of the particular input terminal block 302.

SUMMARY OF THE INVENTION

Accordingly, an object of the present invention is to provide a power drive apparatus in which an increase in cost is avoided by including a filter which is detachable according to whether or not the filter is used, efficiency of manufacturing processes is increased by simplifying an additional wiring process and a process of changing wiring which are required according to whether or not the filter is used, and the filter can be received inside the apparatus, thereby preventing the power drive apparatus from being increased in size due to the filter.

In order to achieve the above object, according to one aspect of the present invention, there is provided a power drive apparatus which comprises a main circuit board including an input terminal block for connection to power-source wires mounted on a major surface of the main circuit board; a power module including a converter unit having diodes and an inverter unit having switching devices and diodes, the power module, mounted on the other major surface of the main circuit board, being for converting and outputting electric power supplied through the input terminal block; a heat-dissipating plate, connected with the power module in contact with a surface of the power module opposite to the main circuit board, for dissipating heat generated by the power module; and a filter module including a filter substrate, provided with a filter circuit and being disposed in the middle of an interconnecting path between the input terminal block and an input section of the converter unit, for suppressing the transmission of noise generated by the switching devices to a power source side. In the power drive apparatus, the heat-dissipating plate provides therein a concave space, and the filter module is received in the concave space and detachably mounted on the heat-dissipating plate.

DETAILED DESCRIPTION OF THE PREFERRED EMBODIMENTS

A best mode for carrying out the present invention is described below with reference to the drawings.
Embodiment 1

Figure 1:
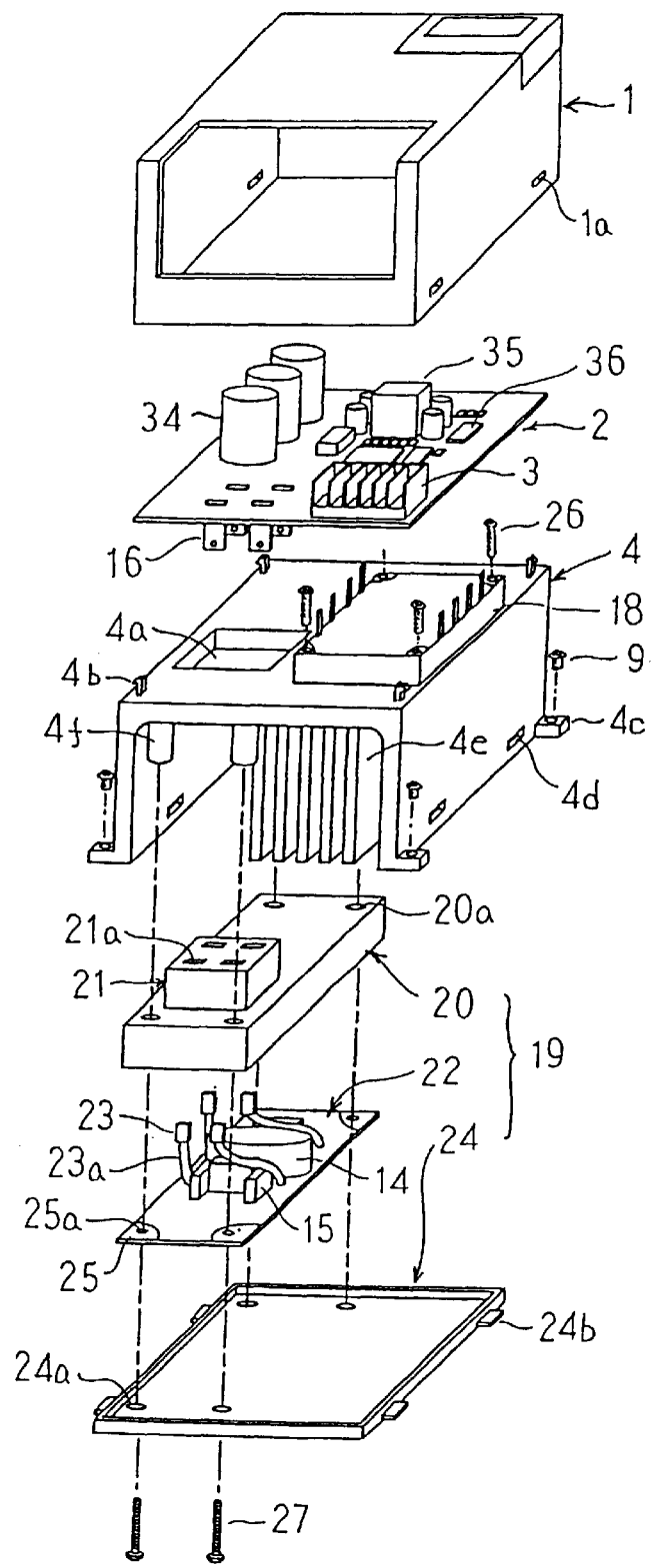
FIG. 1 is an exploded perspective view of a power drive apparatus according to an embodiment 1 of the present invention, in which a filter is mounted.
Figure 2:
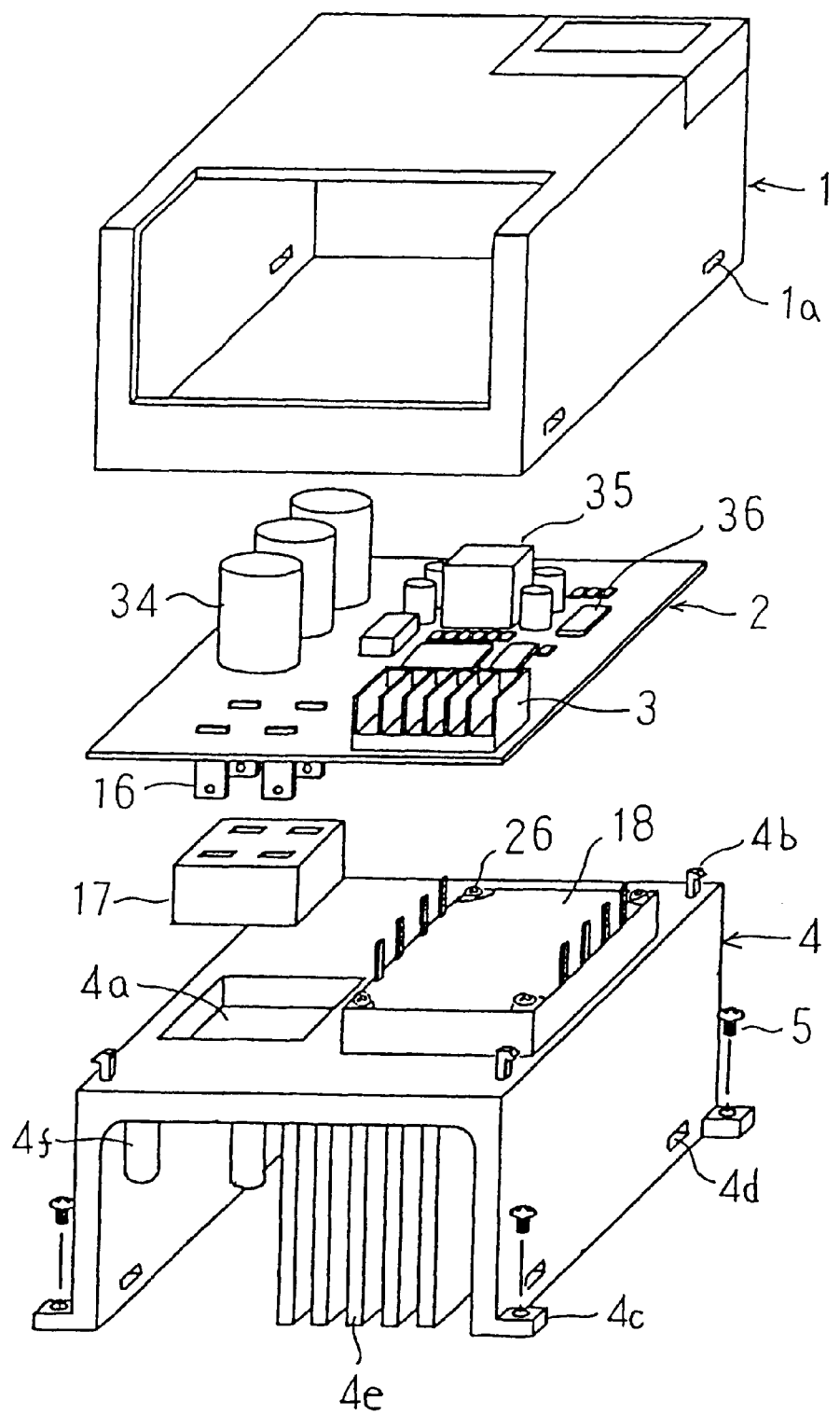
FIG. 2 is an exploded perspective view of the power drive apparatus according to the embodiment 1 of the present invention, in which the filter is not mounted.
Figure 3:
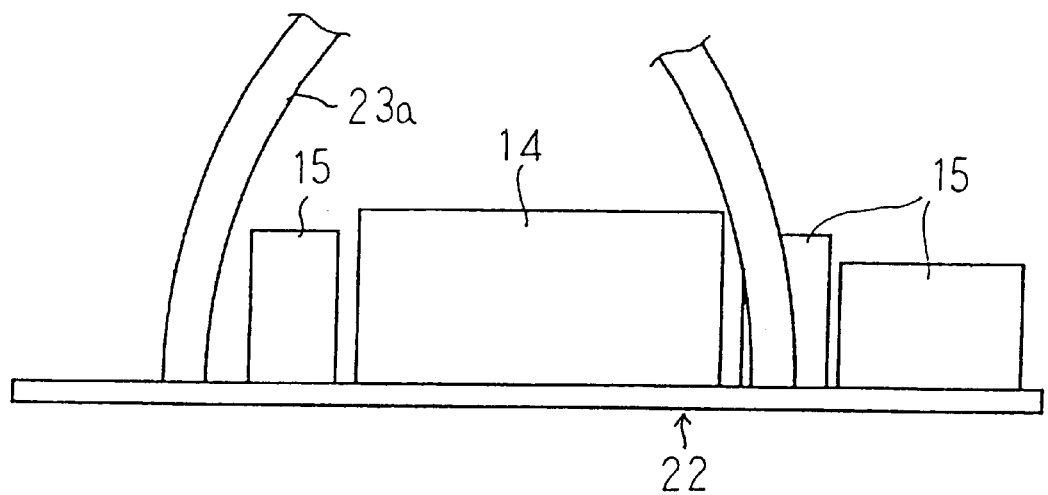
FIG. 3 is a side view of a filter substrate of the power drive apparatus according to the embodiment 1 of the present invention, provided with components mounted on the filter substrate.
Figure 4:
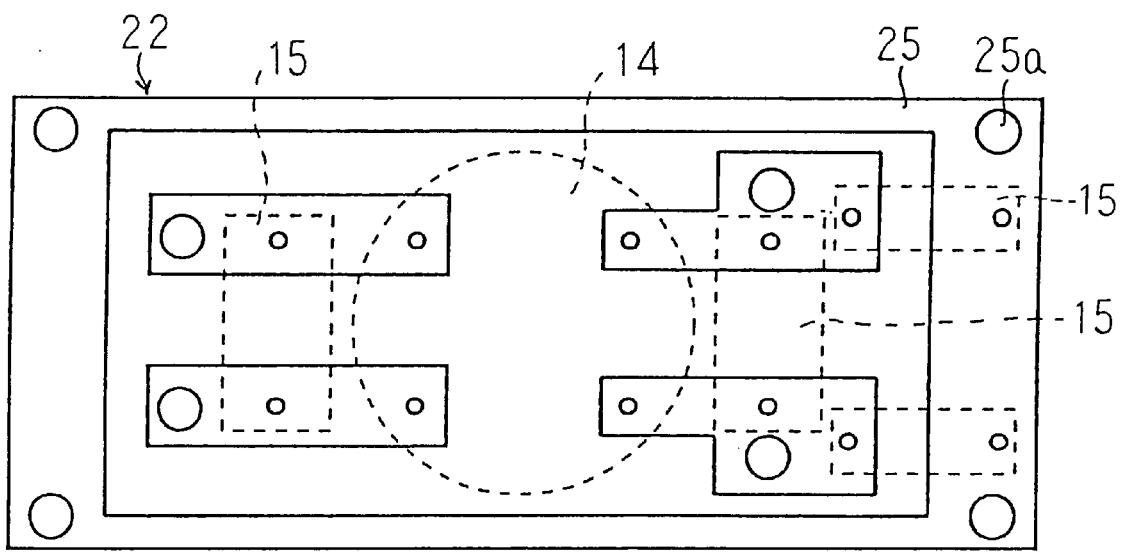
FIG. 4 is a plan view of the filter substrate of the power drive apparatus according to the embodiment 1 of the present invention, provided with an interconnect pattern formed on the filter substrate.
Figure 5:
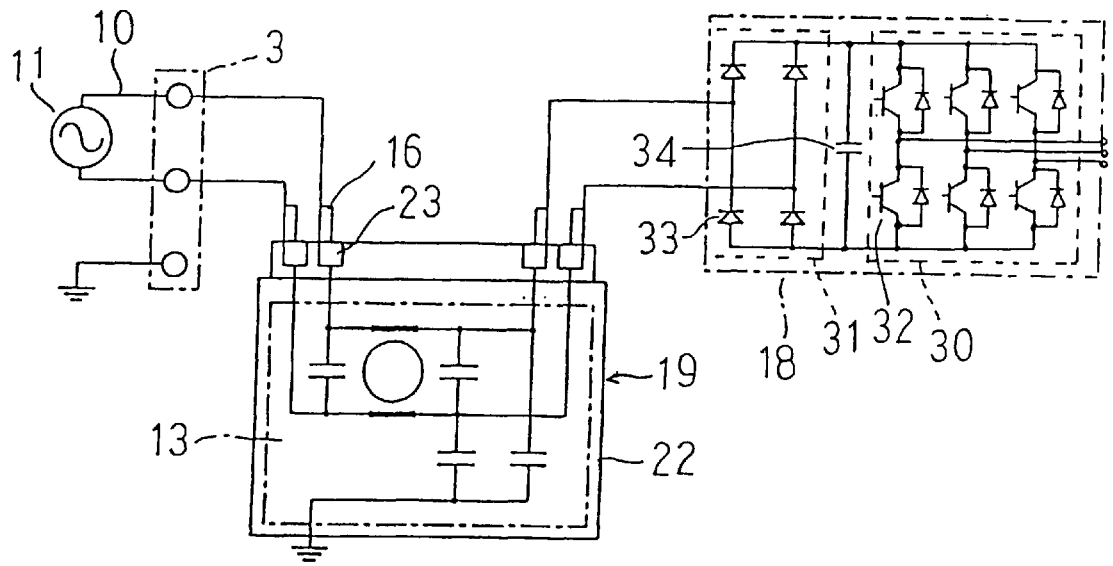
FIG. 5 is a block diagram of a circuit in which the filter is mounted on the power drive apparatus according to the embodiment 1 of the present invention.
Figure 6:
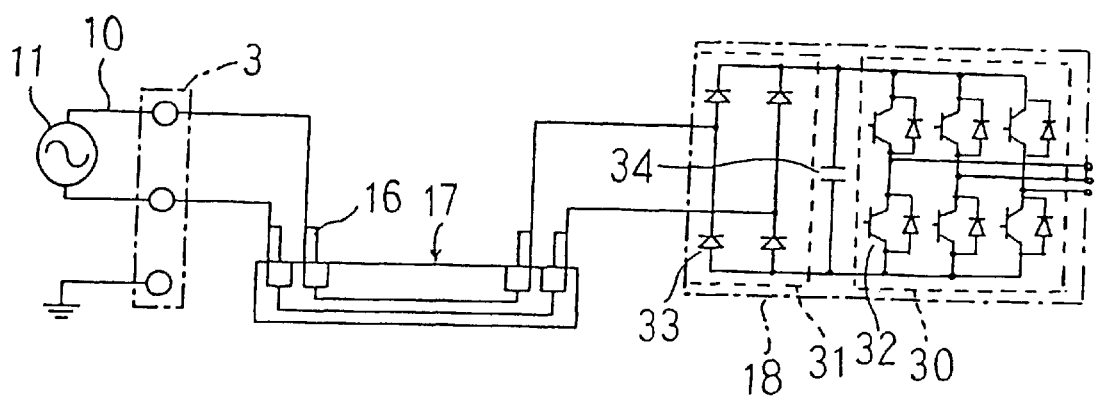
FIG. 6 is a block diagram of a circuit in which the filter is not mounted on the power drive apparatus according to the embodiment 1 of the present invention.
Figure 7:
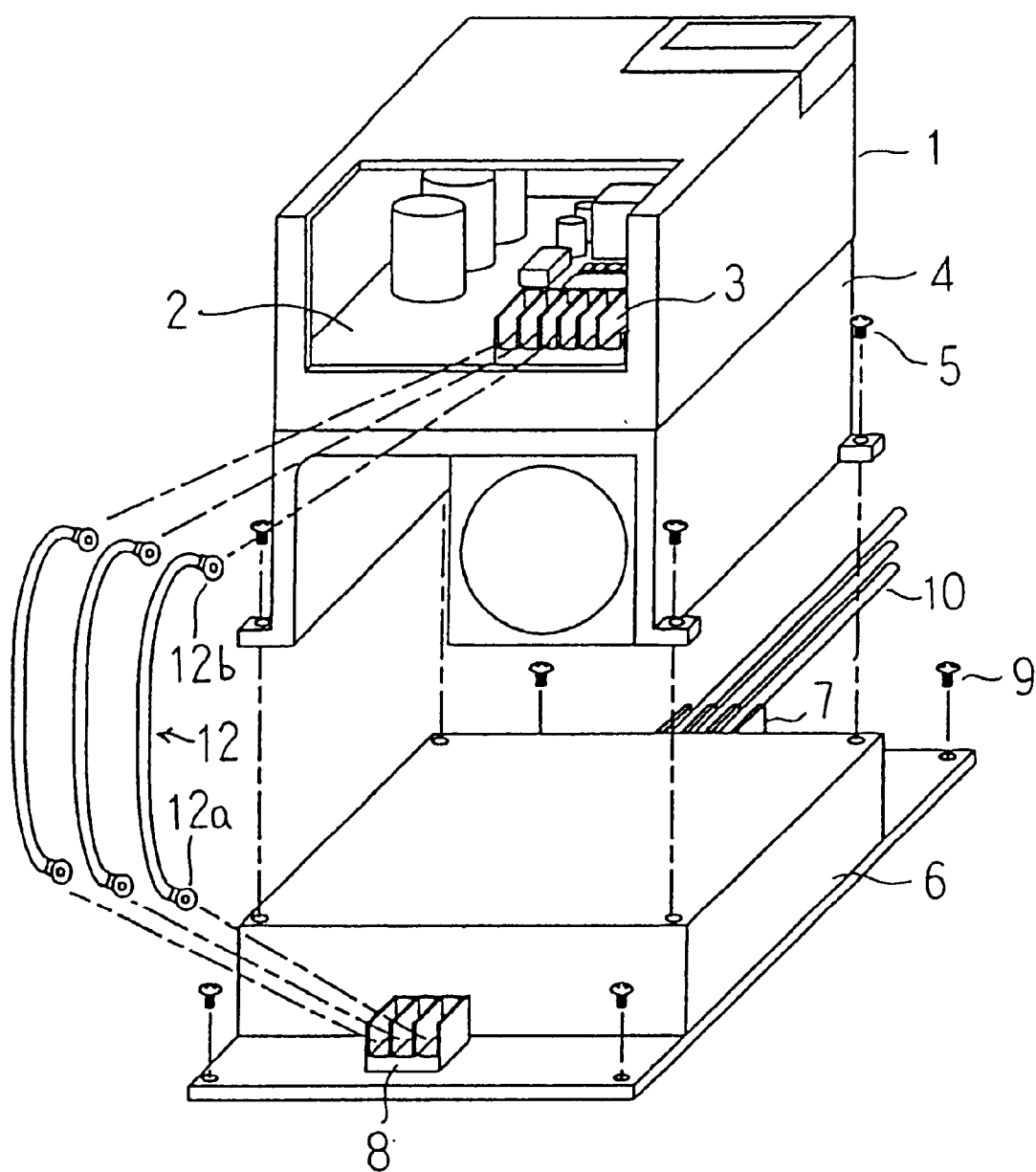
FIG. 7 is an exploded perspective view of a known separate-filter-type power drive apparatus.
Figure 8:
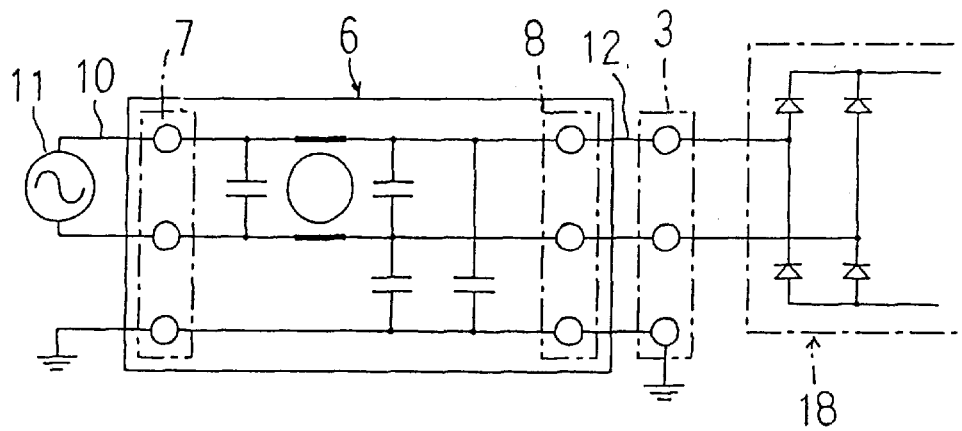
FIG. 8 is a block diagram of a circuit in which a filter is connected to the known separate-filter-type power drive apparatus.
Figure 9:
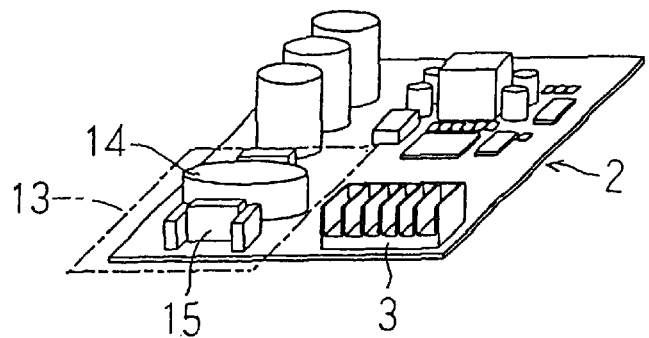
FIG. 9 is a perspective view of a main circuit board of a known filter-built-in-type power drive apparatus.
Figure 10:
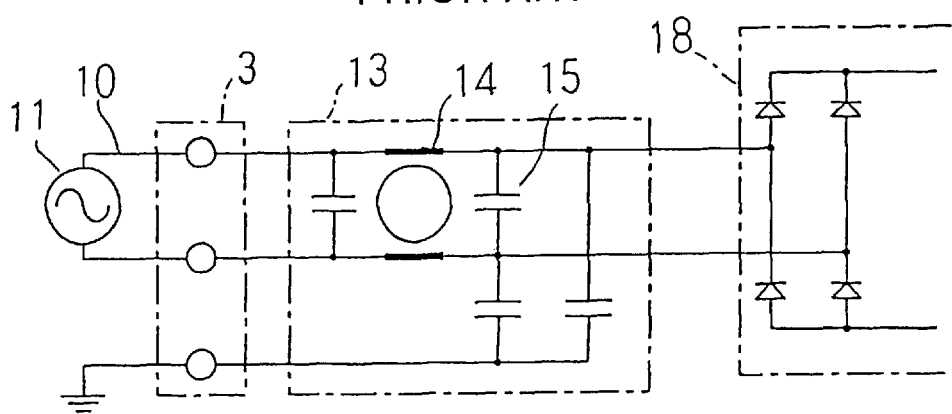
FIG. 10 is block diagram of a circuit of the known filter-built-in-type power drive apparatus.
Figure 11:
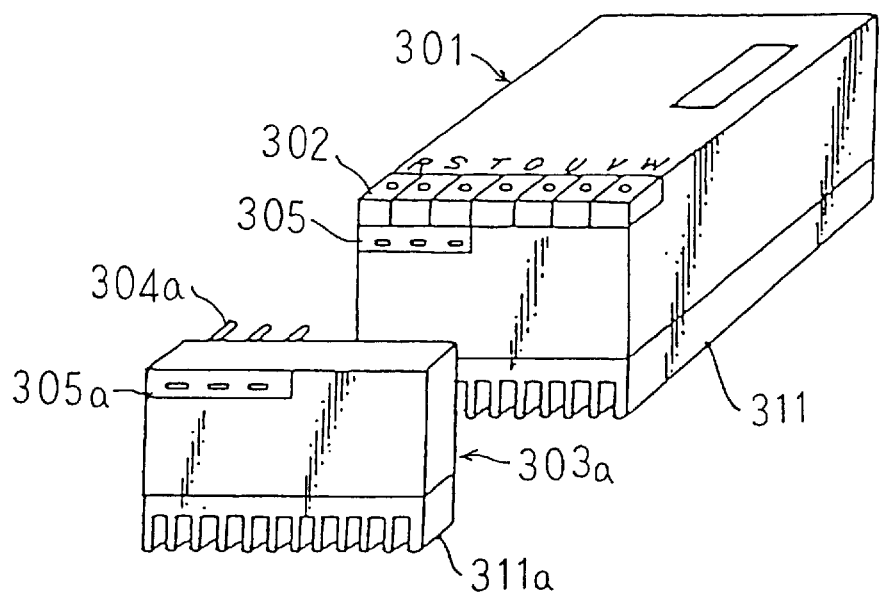
FIG. 11 is a perspective view of a known power drive apparatus including an input internal block having a particular structure.
Figure 12:
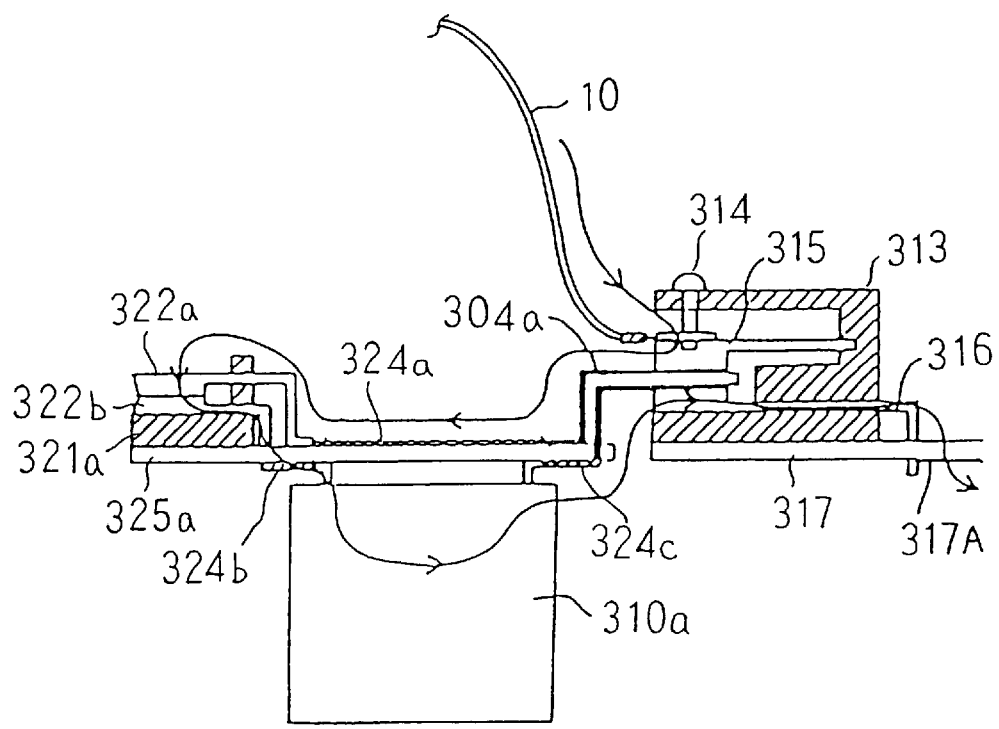
FIG. 12 is a sectional view of the power drive apparatus shown in FIG. 11, provided with a filter unit mounted thereon.

FIG. 1 is an exploded perspective view of a power drive apparatus according to an embodiment 1 of the present invention, in which a filter is mounted. FIG. 2 is an exploded perspective view of the power drive apparatus according to the embodiment 1 of the present invention, in which the filter is not mounted. FIG. 3 is a side view of a filter substrate of the power drive apparatus according to the embodiment 1 of the present invention, provided with components mounted on the filter substrate. FIG. 4 is a plan view of the filter substrate of the power drive apparatus according to the embodiment 1 of the present invention, provided with an interconnecting pattern formed on the filter substrate. FIG. 5 is a block diagram of a circuit in which the filter is mounted on the power drive apparatus according to the embodiment 1 of the present invention. FIG. 6 is a block diagram of a circuit in which the filter is not mounted on the power drive apparatus according to the embodiment 1 of the present invention.

In each drawing, a main circuit board 2 is provided with a given interconnecting pattern formed on a major surface thereon. Components constituting the main circuit, such as smoothing capacitors 34, a transformer 35, and an IC 36 are mounted on the major surface of the main circuit board. The main circuit board 2 is also mounted with an input terminal block 3 for connection to a power source and an external device. A power module 18 includes an inverter unit 30 and a converter unit 31 constituted with switching devices 32 and diodes 33 which are mounted on a metallic substrate. The power module 18 is provided with a plurality of input-output pins extending therefrom. The power module 18 is fixed to a heat-dissipating plate 4 by screws 26. The input-output pins of the power module 18 are inserted, from the lower surface (the other major surface) of the main circuit board 2, to holes formed in the main circuit board 2, and are soldered with the interconnecting pattern, thereby mounting the power module 18 on the main circuit board 2. Portions of the interconnecting pattern of the main circuit board 2 are cut, at which the interconnecting pattern connects the power-source terminal of the input terminal block 3 and an input pin of the converter unit 31 of the power module 18. Each of four switching terminals 16 is connected by soldering with edges of one of the cut portions of the interconnecting pattern at one end of each of the switching terminals 16. The four switching terminals 16 thus connected extend downwardly from the lower surface of the main circuit board 2.

The heat-dissipating plate 4 formed by aluminum die-casting in a U-section also serves as a grounding conductor of the power drive apparatus. The heat-dissipating plate 4 is provided with a through-hole 4a for connection therethrough in a major portion of the heat-dissipating plate 4 so as to oppose the switching terminals 16 when assembling the main circuit board 2. The heat-dissipating plate 4 is also provided with mating fingers 4b protruding at the four corners of the major portion of the heat-dissipating plate 4, flanges 4c protruding at the lower corners of two sides of the heat-dissipating plate 4, and mating holes 4d formed adjacent to lower edges of the two sides of the heat-dissipating plate 4. Heat-dissipating fins 4e are formed at the lower surface of the major portion of the heat-dissipating plates 4 in a portion opposite to the mounting area of the power module 18. Four posts 4f for supporting a filter are provided protruding from the lower surface of the major portion of the heat-dissipating plate 4. A threaded hole is formed at the end of each post 4f. A U-shaped space provided in the heat-dissipating plate 4 except the heat-dissipating fins 4e corresponds to a concave space for receiving a filter module 19.

A case 1 of a resin is made in a box-shape having an aperture toward one side thereof. Mating holes 1a are formed at the periphery of the aperture. The case 1 is mounted on the heat-dissipating plate 4 so that the case 1 covers the main circuit board 2 by mating the mating fingers 4b with the mating holes 1a. A portion of the case 1 is cut away so as to expose the input terminal block 3.

The filter module 19 includes a filter substrate 22 mounted with a choke coil 14 and a capacitor 15 constituting a filter circuit 13, and an upper cover 20 and a lower cover 24 vertically sandwiching the filter substrate 22. The filter substrate 22 is provided with through-holes 25a formed at four corners thereof passing through a grounding pattern 25. The upper and lower covers 20 and 24 are provided with through-holes 20a and 24a, respectively, the through-holes 20a and 24a being disposed at the same positions as those of the through-holes 25a when assembling. A receptor terminal 23 is provided at an end of a wire 23a which is led from each of input terminals and output terminals of the filter circuit 13. The receptor terminals 23 mate with mating holes 21a formed in a receptor terminal housing 21 which is disposed on the upper cover 20. Mating fingers 24b associated with the mating holes 4d of the heat-dissipating plate 4 are provided at edges of the lower cover 24. The filter module 19, in which the upper and lower covers 20 and 24 sandwich the filter substrate 22, is fixed to the heat-dissipating plate 4 at the mounting posts 4f of the heat-dissipating plate 4 by screws 27 passing through the through-holes 24a, 25a, and 20a. When thus assembling, the receptor terminal housing 21 passes through the through-hole 4a. The switching terminals 16 are inserted to the mating holes 21a and mate with the receptor terminals 23, whereby the power-source terminals of the input terminal block 3 are electrically connected to the input pins of the converter unit 31 through the filter circuit 13.

A shortcut board 17 passes upwardly through the through-hole 4a, mates with the switching terminals 16, and connects the cut portions of the interconnecting pattern of the main circuit board 2, thereby electrically connecting the power-source terminals of the input terminal block 3 with the input pins of the converter unit 31 of the power module 18.

The components of the power drive apparatus described above are assembled through the steps described as follows.

The power module 18 is disposed at a given position on the upper surface of the major portion of the heat-dissipating plate 4 with the input-output pins disposed in a upward direction, and fixed to the heat-dissipating plate 4 by the screws 26. The power module 18 is coated with silicone grease in advance at the lower surface thereof. The power module 18 and the heat-dissipating plate 4 are connected with each other either directly or through the silicone grease without gaps therebetween.

The input-output pins of the power module 18 pass through the holes provided in the main circuit board 2, and the input-output pins are soldered with the interconnecting pattern of the main circuit board 2, thereby connecting the main circuit board 2 with the power module 18. The ends of the switching terminals 16 are disposed in the through-hole 4a.

The case 1 is downwardly applied to the heat-dissipating plate 4 so as to cover the main circuit board 2. In this step, the mating fingers 4b protruding from the upper surface of the major portion of the heat-dissipating plate 4 mate with the mating holes 1a, whereby the case 1 is mounted on the heat-dissipating plate 4.

The filter substrate 22 sandwiched by the upper cover 20 and the lower cover 24 is fixed to the heat-dissipating plate 4 at the mounting posts 4f by the conductive screws 27 passing through the through-holes 24a, 25a, and 20a. In this step, the mating fingers 24b mate with the mating holes 4d. The filter module 19 is fixed to the heat-dissipating plate 4 by a screwing force of the screws 27 and a coupling force between the mating fingers 24b and the mating holes 4d. The receptor terminal housing 21 is disposed in a manner such that, when assembling, the receptor terminal housing 21 passes through the through-hole 4a and the mating holes 2 1a are disposed at the positions of the switching terminals 16, whereby the switching terminals 16 are inserted to the mating holes 21a and mate with the receptor terminals 23 by a screwing force of the screws 27. In this step, the power-source terminals of the input terminal block 3 are electrically connected to the input pins of the converter unit 31 of the power module 18 through the filter circuit 13. The grounding pattern 25 of the filter substrate 22 is electrically connected, through the conductive screws 27, to the heat-dissipating plate which also serves as a grounding conductor of the power drive apparatus, thereby grounding the filter circuit 13.

The power drive apparatus thus fabricated is fixed to an installation location such as a stand by screws 9 passing through holes provided in the flanges 4c of the heat-dissipating plate 4. A power source 11 and the power drive apparatus are electrically connected to each other by connecting power-source wires 10 with the input terminal block 3. The filter module 19 is disposed between the input terminal block 3 and the power module 18, as shown in FIG. 5, thereby suppressing the transmission of noise to the power source 11 from the switching devices constituting the power module 18.

For a use of the power drive apparatus in which the filter is not required, the filter module 19 is removed by removing the screws 27, and the shortcut board 17 is upwardly inserted to the through-hole 4a and is mated with the switching terminals 16. The shortcut board 17 connects the cut portions of the interconnecting pattern, thereby connecting the power-source terminals of the input terminal block 3 to the input pins of the converter unit 31 of the power module 18 as shown in FIG. 6.

According to the embodiment 1, the filter module 19 is received in the U-shaped heat-dissipating plate 4, whereby an additional space for the filter module 19 is not required, thereby preventing the overall size of the apparatus from increasing.

The filter module 19 is detachable because the filter module 19 is fixed to the heat-dissipating plate 4 by the screws 27. Therefore, the filter module 19 can be eliminated for uses of the power drive apparatus in which the filter is not required, thereby preventing the manufacturing cost from being increased due to an unnecessary component.

Since the filter module 19 is disposed between an input section of converter unit 31 and the input terminal block 3 connected to the power-source wires 10, the power drive apparatus operates by connecting the power-source wires 10 to the input section of the converter unit 31, whereby it is not necessary to change the wiring in the power drive apparatus, thereby improving the efficiency in the assembling process.

The heat-dissipating plate 4 also serves as a grounding conductor, and the filter module 19 is fixed to the heat-dissipating plate 4 by the conductive screws 27 passing through the grounding pattern 25 of the filter substrate 22 so as to electrically contact with the grounding pattern 25, whereby the filter circuit 13 can be grounded, without providing an additional grounding unit, through the screws 27 fixing the filter module 19 to the heat-dissipating plate 4, thereby improving efficiency of the assembling process. Moreover, it is not necessary to prepare an additional grounding terminal, thereby decreasing the cost by omitting that component.

Since a principal object of a noise filter is to eliminate common mode noise generated between a power source and grounding, a capacitor is provided between the power-source wires and the grounding wire. The grounding connection of a noise filter circuit is a matter of importance, and it is necessary to suppress grounding impedance to as low a level as possible. In the present embodiment, the grounding pattern 25 of the filter substrate 22 is electrically connected to the heat-dissipating plate 4 serving as a grounding conductor through the conductive screws 27, thereby sufficiently suppressing the grounding impedance, whereby the effect of the efficient noise filter is shown.

An interconnecting path between the input terminal block 3 of the main circuit board 2 and the input section of the converter unit 31 is cut, a plurality of the switching terminals 16 electrically connected to each of the cut portions of the interconnecting path extend inside the through-hole 4a from the main circuit board 2, and the switching terminals 16 are electrically connected to the input and output terminals of the filter circuit 13 through the wires 23a, respectively. A plurality of the receptor terminals 23 to mate with the plurality of switching terminals 16 are received in the receptor terminal housing 21. When the filter module 19 is applied upwardly and fixed to the filter-mounting posts 4f by the screws 27, the plurality of receptor terminals 23 mate respectively with the plurality of switching terminals 16, whereby the filter circuit 13 is provided in the middle of the interconnecting path between the input terminal block 3 and the input section of the converter unit 31. By simply mounting the filter module 19 on the heat-dissipating plate 4, the filter circuit 13 is provided in the middle of the interconnecting path between the input terminal block 3 and the input section of the converter unit 31, additional wiring processes and/or processes for changing wiring, which are otherwise required, are eliminated, thereby improving the efficiency of the process.

When the filter module 19 is not needed, the shortcut board 17 is coupled with a plurality of the switching terminals 16 extending in the through-hole 4a from the main circuit board 2, thereby connecting the cut portions to each other of the interconnecting path. With this arrangement, the additional wiring processes and/or the processes for changing wiring are replaced by simply coupling the shortcut board 17, thereby improving the efficiency of the process.

Although the filter module 19 is received in a space formed by the heat-dissipating plate 4 having a U-shaped section, in the above-described embodiment 1, the sectional shape of the heat-dissipating plate 4 is not limited to a U-shape, and it may be any shape which provides a space for receiving the filter module 19.

According to the embodiment 1, although the filter module 19 is fixed to the heat-dissipating plate 4 by the screws 27, the fixing member is not limited to screws. The filter module 19 may be fixed detachably to the heat-dissipating plate 4 by any other method.

According to the present invention, as described above, a power drive apparatus comprises a main circuit board including an input terminal block for connection to power-source wires mounted on a major surface of the main circuit board; a power module including a converter unit having diodes and an inverter unit having switching devices and diodes, the power module, mounted on the other major surface of the main circuit board, being for converting and outputting electric power supplied through the input terminal block; a heat-dissipating plate, connected with the power module in contact with a surface of the power module opposite to the main circuit board, for dissipating heat generated by the power module; and a filter module including a filter substrate, provided with a filter circuit and being disposed in the middle of an interconnecting path between the input terminal block and an input section of the converter unit, for suppressing the transmission of noise generated by the switching devices to a power source side. In the power drive apparatus, the heat-dissipating plate provides therein a concave space, and the filter module is received in the concave space and detachably mounted on the heat-dissipating plate. With this arrangement, an additional space for receiving the filter module is not required, thereby preventing the unit from increasing in size, the filter module is detachable according to whether or not a filter is needed, thereby avoiding an increase in cost due to an unnecessary component, and the power-source wires are connected invariably to the input terminal block, thereby simplifying additional wiring processes and process for changing wiring.

The heat-dissipating plate may also serve as a grounding conductor, and the filter module may be fixed to the heat-dissipating plate by the conductive screws passing through a grounding pattern provided on the filter substrate so that the conductive screws are electrically connected to the grounding pattern. With this arrangement, a filter circuit is grounded simply by mounting the filter module, thereby eliminating an additional grounding terminal.

The concave space may be formed in the heat-dissipating plate so as to have an aperture toward a side opposite to the main circuit board side. A through-hole may be formed in the heat-dissipating plate so that the main circuit board side and the concave space are communicated with each other. An interconnecting path may be cut in the middle between the input terminal block of the main circuit board and the input section of the converter unit. A plurality of switching terminals electrically connected to each edge of cut portions of the interconnecting path may extend in the through-hole from the main circuit board. The plurality of switching terminals may be electrically connected through wires to the input terminals and output terminals of the filter circuit, respectively. A plurality of receptor terminals may be provided in the filter module, the receptor terminals being capable of coupling with the plurality of switching terminals. When the filter module is received in the concave space and is fixed to the heat-dissipating plate by the screws through the aperture of the concave space formed toward the side opposite to the main circuit board side, the plurality of receptor terminals may be coupled with the plurality of switching terminals, whereby the filter circuit is provided in the middle of the interconnecting path between the input terminal block and the input section of the converter unit. With this arrangement, additional wiring processes and processes for changing wiring, which are otherwise needed, are not required when the filter is mounted, thereby significantly increasing the efficiency of the process.

When the filter module is not needed, a shortcut board may be provided for connecting the cut portions to each other of the interconnecting path by being coupled with a plurality of the switching terminals extending in the through-hole from the main circuit board. With this arrangement, the additional wiring processes and the processes for changing wiring are replaced by simply coupling the shortcut board, thereby improving the efficiency of the process.

What is claimed is:

1. A power drive apparatus comprising,
    a main circuit board including an input terminal block for connection to power-source wires mounted on a major surface of said main circuit board;
    a power module including a converter unit having diodes and an inverter unit having switching devices and diodes, the power module, mounted on the other major surface of said main circuit board, being for converting and outputting electric power supplied through said input terminal block;
    a heat-dissipating plate, connected with said power module in contact with a surface of said power module opposite to said main circuit board, for dissipating heat generated by said power module; and
    a filter module including a filter substrate provided with a filter circuit, and being disposed in the middle of an interconnecting path between said input terminal block and an input section of said converter unit, for suppressing the transmission of noise generated by said switching devices to a power source side,
    wherein said heat-dissipating plate provides therein a concave space, and said filter module is received in said concave space and is detachably mounted on said heat-dissipating plate.

2. The power drive apparatus according to claim 1, wherein said heat-dissipating plate also serves as a grounding conductor, and said filter module is fixed to said heat-dissipating plate by conductive screws passing through a grounding pattern provided on said filter substrate so that said conductive screws are electrically connected to the grounding pattern.

3. The power drive apparatus according to claim 1, wherein
    said concave space is formed in said heat-dissipating plate so as to have an aperture toward a side opposite to said main circuit board side;
    a through-hole is formed in said heat-dissipating plate so that said main circuit board side and said concave space are communicated with each other;
    an interconnecting path between said input terminal block of said main circuit board and the input section of said converter unit is cut in the middle;
    a plurality of switching terminals electrically connected to each edge of cut portions of said interconnecting path extend in the through-hole from said main circuit board, the plurality of switching terminals being electrically connected through wires to the input terminals and output terminals of said filter circuit, respectively;
    a plurality of receptor terminals are provided in said filter module, the receptor terminals being capable of coupling with the plurality of switching terminals; and
    the plurality of receptor terminals are coupled with the plurality of switching terminals, respectively, and said filter circuit is thereby provided in the middle of the interconnecting path between said input terminal block and the input section of said converter unit, when said filter module is received in said concave space and is fixed to said heat-dissipating plate by said screws through the aperture of said concave space formed toward a side thereof opposite to said main circuit board side.

4. The power drive apparatus according to claim 3, further comprising a shortcut board for connecting edges of the cut portions of the interconnecting path to each other by being coupled with the plurality of switching terminals extending in the through-hole from said main circuit board, when said filter module is removed.

* * * * *